United States Patent
Lohokare et al.

(10) Patent No.: US 6,821,899 B2
(45) Date of Patent: Nov. 23, 2004

(54) SYSTEM, METHOD AND APPARATUS FOR IMPROVED LOCAL DUAL-DAMASCENE PLANARIZATION

(75) Inventors: Shrikant P. Lohokare, Fremont, CA (US); Andrew D. Bailey, III, Pleasanton, CA (US); David Hemker, San Jose, CA (US); Joel M. Cook, Warrenton, VA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/390,520

(22) Filed: Mar. 14, 2003

(65) Prior Publication Data

US 2004/0180545 A1 Sep. 16, 2004

(51) Int. Cl.$^7$ .............................................. H01L 21/311
(52) U.S. Cl. ...................................................... 438/697
(58) Field of Search ................................ 438/687, 635, 438/633, 697, 700, 706

(56) References Cited

U.S. PATENT DOCUMENTS

| | | | |
|---|---|---|---|
| 5,098,516 A | | 3/1992 | Norman et al. |
| 5,256,565 A | | 10/1993 | Bernhardt et al. |
| 5,387,315 A | | 2/1995 | Sandhu |
| 5,968,847 A | | 10/1999 | Ye et al. |
| 6,051,496 A | * | 4/2000 | Jang ............................ 438/687 |
| 6,056,864 A | | 5/2000 | Cheung |
| 6,096,230 A | * | 8/2000 | Schatz et al. ................. 216/38 |
| 6,234,870 B1 | | 5/2001 | Uzoh et al. |
| 6,350,364 B1 | * | 2/2002 | Jang ............................ 205/118 |
| 6,383,935 B1 | | 5/2002 | Lin et al. |
| 6,417,093 B1 | * | 7/2002 | Xie et al. ..................... 438/626 |
| 6,600,229 B2 | * | 7/2003 | Mukherjee et al. ......... 257/762 |
| 6,739,953 B1 | * | 5/2004 | Berman et al. ............... 451/41 |

FOREIGN PATENT DOCUMENTS

| | | |
|---|---|---|
| WO | WO 00/03426 | 1/2000 |
| WO | WO 01/88229 | 11/2001 |

OTHER PUBLICATIONS

Y. Oshita and N. Howi, "Lower temperature plasma etching of Cu using IR light irradiation", 1995 Elsevier Science S.A.
Lynn R. Allen and John M. Grant, "Tungsten plug etchback and substrate damage measured by atomic force microscopy", May/Jun. 1995, J. Vac. Sci Technol. B 13(3).
N. Hosoi and Y. Ohshita, "Plasma Etching of Copper Films Using IR Light Irradiation", 1994, Mat. Res. Soc. Symp. Proc. vol. 337.
William F. Marx, Yunju Ra, Richard Yang and Ching–Hwa Chen, "Plasma and processing effects of electrode spacing for tungsten etchback using a bipolar electrostatic wafer clamp", Nov./Dec. 1994, J. Vac. Sci. Technol. A 12(6).
J. Farkas, K.–M. Chi, M.J. Hampden–Smith, T.T. Kodas and L.H. Dubois, "Low–temperature copper etching via reactions with CI$_2$ and Pet$_3$ under ultrahigh vacuum conditions", Feb. 1, 1993, J. Appl. Phys. 73 (3).
Seongju Park, T.N. Rhodin and L.C. Rathbun, "Halide formation and etching of Cu thin films with CI$_2$ and Br$_2$", Mar./Apr. 1986 J. Vac. Sci. Technol. A 4 (2).
Lynn R. Allen, "Tungsten Plug Etchback In A TCP Etcher".

* cited by examiner

Primary Examiner—David Nelms
Assistant Examiner—Quoc Hoang
(74) Attorney, Agent, or Firm—Martine & Penilla LLP

(57) ABSTRACT

A system and method for planarizing a patterned semiconductor substrate includes receiving a patterned semiconductor substrate. The patterned semiconductor substrate having a conductive interconnect material filling multiple of features in the pattern. The conductive interconnect material having an overburden portion. The overburden portion includes a localized non-uniformity. An additional layer is formed on the overburden portion. The additional layer and the overburden portion are planarized. The planarizing process substantially entirely removes the additional layer.

27 Claims, 8 Drawing Sheets

SYSTEM, METHOD AND APPARATUS FOR IMPROVED LOCAL DUAL-DAMASCENE PLANARIZATION

CROSS REFERENCE TO RELATED APPLICATIONS

This application is related to co-pending U.S. patent application Ser. No. 10/390,117 filed on Mar. 14, 2003 and entitled "System, Method and Apparatus For Improved Global Dual-Damascene Planarization," which is incorporated herein by reference in its entirety.

BACKGROUND OF THE INVENTION

1. Field of the Invention

The present invention relates generally to dual damascene semiconductor manufacturing processes, and more particularly, to methods and systems for planarizing features and layers in a semiconductor manufacturing process.

2. Description of the Related Art

Dual damascene manufacturing processes are becoming more common in semiconductor manufacturing. In a typical dual damascene manufacturing process, one or more conductive materials are deposited in previously patterned trenches and vias formed in a semiconductor substrate or films formed on the semiconductor substrate to form the desired electrical circuit interconnects. An excess or overburden portion of the conductive material is often formed. The overburden portion of the conductive material is unnecessary and undesirable and must be removed both to produce a damascene feature and to provide a planar surface for subsequent processing.

The overburden portion of the conductive material is typically removed from the semiconductor substrate through chemical mechanical polishing (CMP) and electro-chemical polishing (ECP) (e.g., etching) processes and combinations of CMP and ECP processes. Each of these processes has significant shortfalls. By way of example, ECP typically has a relatively low throughput, poor uniformity and inability to effectively remove non-conductive material.

CMP requires physical contact processes which typically leave conductive residues, or cause corrosion of the various materials, or result in non-uniform removal, and the inability to suitably planarize interconnect and interlevel dielectric (ILD) top surface. CMP can also cause stress related damage (e.g., interlayer delamination, peeling) to remaining interconnect and ILD structures. The CMP-caused stress damage is further exacerbated by the very poor inter-layer adhesion characteristics of the more-recently used materials. Reducing the physical force of the CMP process to reduce the physical stress can often result in unacceptably low throughput rates and other poor process performance parameters.

In view of the foregoing, there is a need for an improved planarizing system and method to uniformly and substantially remove overburden material while minimizing physical stress to the remaining features. The improved planarizing system and method should be suitable for use in semiconductor manufacturing and should be applicable to processes such as a dual damascene process or other semiconductor manufacturing processes.

SUMMARY OF THE INVENTION

Broadly speaking, the present invention fills these needs by providing a system and method for planarizing a semiconductor substrate. It should be appreciated that the present invention can be implemented in numerous ways, including as a process, an apparatus, a system, computer readable media, or a device. Several inventive embodiments of the present invention are described below.

One embodiment includes a method for planarizing a patterned semiconductor substrate includes receiving a patterned semiconductor substrate. The patterned semiconductor substrate having a conductive interconnect material filling multiple of features in the pattern. The conductive interconnect material having an overburden portion. The overburden portion includes a localized non-uniformity. An additional layer is formed on the overburden portion. The additional layer and the overburden portion are planarized. The planarizing process substantially entirely removes the additional layer. The conductive interconnect material can include copper, copper containing conductive materials and elemental copper and other conductive material. The pattern can be formed on the patterned semiconductor substrate in a dual damascene process.

Planarizing the additional layer and the overburden portion can include substantially eliminating a local, pattern dependant non-uniformity. Planarizing the additional layer and the overburden portion can also include substantially eliminating a local, pattern dependant non-uniformity without imparting mechanical stress to the plurality of features.

The additional layer and the overburden portion can have a substantially 1:1 etch selectivity. The additional layer is formed substantially planar. The additional layer is a substantially planar fill material. Planarizing the additional layer and the overburden portion can also include etching the additional layer and at least part of the overburden portion. A second etch process to expose a barrier layer formed on the patterned features can also be included.

Forming the additional layer on the overburden portion can include chemically converting a top surface and a top portion of the overburden portion. Chemically converting a top surface and a top portion of the overburden portion can include exposing the top surface of the overburden portion to a reactant gas such as a halogen. The additional layer is a halide reactant product of the overburden portion.

Planarizing the additional layer and the overburden portion can include etching the additional layer and at least part of the overburden portion. Planarizing the additional layer and the overburden portion can also include a reiterative process that includes etching the additional layer, forming a second additional layer, and etching the second additional layer. The reiterative process can be an in situ reiterative process.

In another embodiment, a semiconductor device is formed by a method including receiving a patterned semiconductor substrate. The patterned semiconductor substrate having a conductive interconnect material filling multiple features in the pattern. The conductive interconnect material having an overburden portion that includes a localized non-uniformity. An additional layer is formed on the overburden portion and the additional layer and the overburden portion are planarized. The additional layer being substantially entirely removed in the planarizing process.

Yet another embodiment includes a method of forming a dual damascene interconnect structure that includes receiving a dual damascene patterned semiconductor substrate. The dual damascene patterned semiconductor substrate having a conductive interconnect material filling multiple features in the dual damascene pattern. The conductive interconnect material having an overburden portion that includes a localized non-uniformity. An additional layer is formed on the overburden portion. The additional layer being formed substantially planar. The additional layer and at least part of the overburden portion are etched to substantially planarize the overburden portion, the additional layer being substantially entirely removed.

Still another embodiment includes a method of forming a dual damascene interconnect structure that includes receiving a dual damascene patterned semiconductor substrate. The dual damascene patterned semiconductor substrate having a conductive interconnect material filling multiple features in the dual damascene pattern. The conductive interconnect material having an overburden portion that includes a localized non-uniformity. A top surface and a top portion of the overburden portion are chemically converted to form an additional layer on the overburden portion. The additional layer and the overburden portion are planarized, the additional layer being substantially entirely removed in the planarizing process. The planarizing process including a reiterative process that includes etching the additional layer, forming a second additional layer, and etching the second additional layer. The reiterative process can be continued until the remaining overburden portion is substantially planarized.

The present invention provides the advantage of minimizing mechanical stress while substantially eliminating localized non-uniformities.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved planarizing system and method will now be described. It will be apparent to those skilled in the art that the present invention may be practiced without some or all of the specific details set forth herein.

One embodiment of an improved planarizing system and method provides improved local planarization uniformity across a local portion of a semiconductor substrate. The improved local planarization uniformity substantially eliminates local nonuniformities caused by features in underlying layers and variations in deposition processes. Another embodiment provides improved global planarization uniformity across the entire substrate (e.g., edge uniformity as compared to center uniformity).

Figure 1:
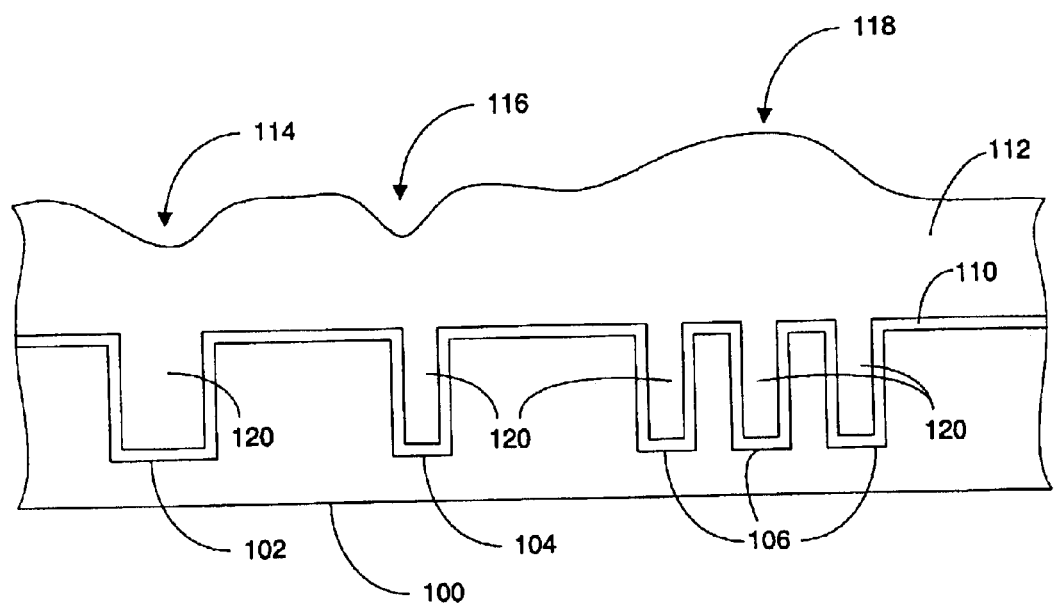
FIG. 1 shows a patterned semiconductor substrate in accordance with one embodiment of the present invention.

FIG. 1 shows a patterned semiconductor substrate 100 in a dual damascene process in accordance with one embodiment of the present invention. The substrate 100 has been patterned as part of the semiconductor manufacturing process such as a dual damascene manufacturing process. A mask can be used to pattern the substrate 100. The substrate 100 includes a large, somewhat isolated feature 102 (e.g., trench, via, etc.) a smaller, somewhat isolated feature 104 and several features 106 that are densely packed together. A barrier layer 110 is also included. The barrier layer 110 is typically a different material than the substrate 100 or a conductive interconnect material 120. The conductive interconnect material 120 can be copper or copper alloy or other conductive material.

An overburden portion 112 of the conductive interconnect material 120 extends above the features 102, 104, 106 and includes corresponding localized variations 114, 116, 118 in thickness of the overburden portion 112. As shown, the larger feature 102 has a corresponding larger decrease in the thickness of the overburden portion 112 as compared to the smaller feature 104, which has a slightly smaller variation in thickness of the overburden portion 112. The densely packed features 106 have a somewhat increased thickness of the overburden portion 112.

Typical etch processes etch the overburden portion 112 of the conductive interconnect material 120 at a fairly uniform rate over the entire wafer area and therefore the typical etching process will expose the barrier layer 110 near the large feature 102 before the barrier layer 110 near the densely packed features 106 will be exposed. In sum, the typical etching process cannot planarize the overburden portion 112 of the conductive interconnect material.

Figure 2:
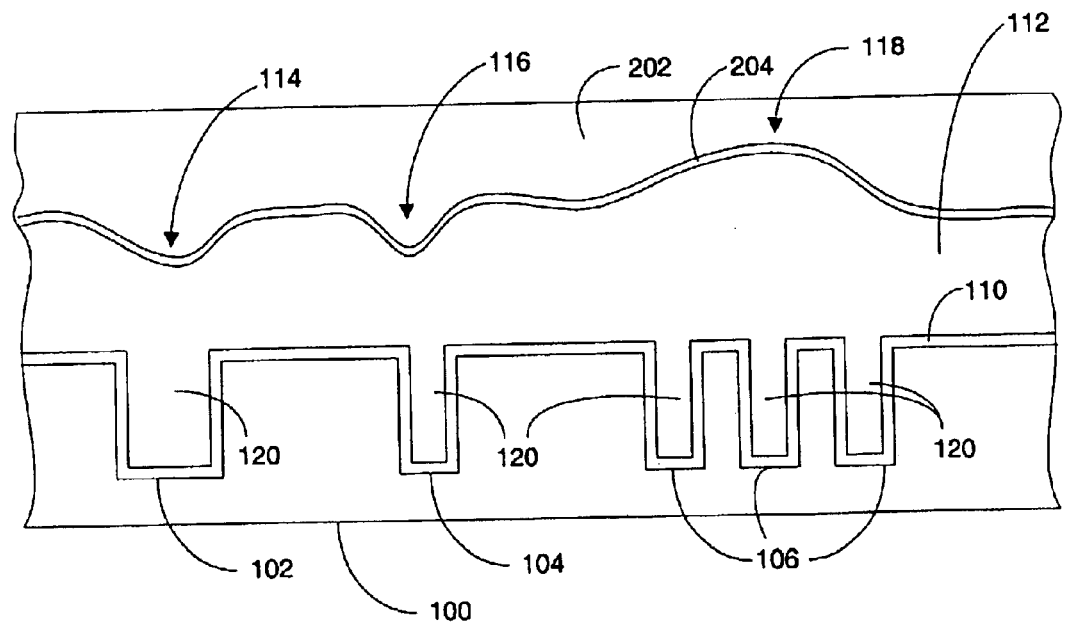
FIG. 2 shows an additional layer added in accordance with one embodiment of the present invention.

FIG. 2 shows an additional layer 202 added in accordance with one embodiment of the present invention. The additional layer 202 is formed on top of the overburden portion 112. The additional layer 202 can be a substantially planar fill material (e.g., spin on glass (SOG), polysilicon, polymer resist, bilayer, UV or thermally curable material, or other material that can flow to form a planar surface and which has the appropriate etching characteristics). An optional, relatively thin (e.g., about 25–100 nm in thickness) conformal layer 204 may also be included between the additional layer 202 and the overburden portion 112. The conformal layer 204 can be a barrier layer or an adhesion layer. The conformal layer 204 can allow a wider variety of materials that can be used for the additional layer 202.

The additional layer 202 and the overburden portion 112 have a substantially 1:1 etch selectivity so that a subsequent etching process (e.g., plasma or gaseous etch process) can etch both the additional layer 202 and the overburden portion 112 at substantially the same rate.

Figure 3:
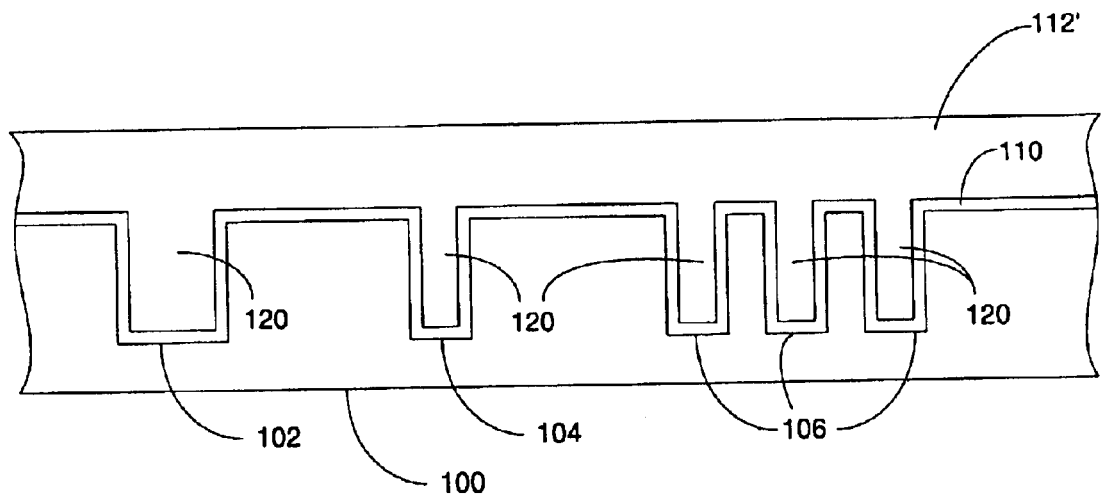
FIG. 3 shows a substantially planar overburden portion in accordance with one embodiment of the present invention.

FIG. 3 shows a substantially planar overburden portion 112' in accordance with one embodiment of the present invention. Because the additional layer 202 forms a substantially planar surface over the stack of layers 100, 110, 112, 202, a first etching process can uniformly etch the additional layer 202 and the overburden 112 over the entire area until the remaining overburden portion 112' is substantially locally planar in that the local variations 114, 116, 118 are substantially eliminated.

A typical recipe would involve conditions that provide a 1:1 etch selectivity between the additional layer 202 and the overburden portion 112. By way of example, if the additional layer 202 is SOG, and the overburden portion 112 is copper, then a halogen (e.g., Cl, F, Br, I) based chemistry provides etch rate control for both the SOG as well as copper to allow for tuning for the desired 1:1 selectivity. Although any plasma feed gas producing reactive halogen radicals can be used, CF4, Cl2, and HCl are typical examples. Various process parameters can be adjusted to control etch rates, selectivity, uniformity and reduce corrosion include variation of process variables such as substrate temperature and inclusion of one or more additives (e.g., Ar, H2, Cl, O2, CH3X (X=F, Cl, Br, I), CH2F2, and CH4).

Another approach involves a sputter dominant etch with Ar or other inert gas such as He, Xe, Ne, Kr, as the primary etchant of the copper overburden portion 112 with other additives to provide etch rate control of the additional layer 202 and passivation of the top surface of the remaining copper 112. The other additives can include, for example H2 and/or CF4. Either of these processes is can operate over a wide temperature range of between about 75 degrees C. and about 400 degrees C.

The first etching process is an etch process designed to leave the remaining overburden portion 112' substantially locally planar in that the local variations 114, 116, 118 are substantially eliminated. One or more subsequent etching processes will remove the bulk or the majority of the overburden portion 112'. A finish etching process can be applied to continue the etching process to an endpoint at which the overburden portion 112' is removed from the barrier 110. The finish etching process can also be included in the bulk etch process. Subsequent processes after the finish etch can include selective barrier removal and passivating the remaining conductive material 120 to prevent corrosion and provide stability for further processing. An additional operation after the finish etch can be designed not to significantly remove any material but only passivate the remaining conductive material 120 to prevent corrosion and provide stability for further processing.

Figure 4A:
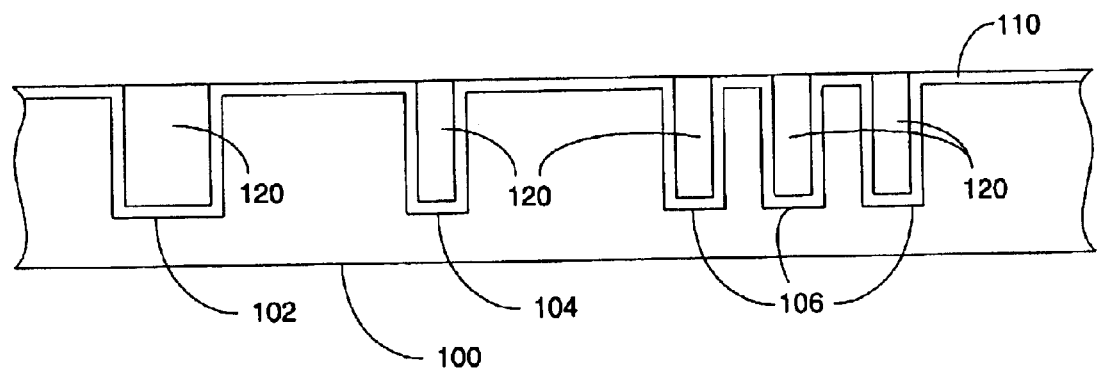
FIG. 4A shows the substrate having undergone a second etching process in accordance with one embodiment of the present invention.

FIG. 4A shows the substrate 100 having undergone a second etching process in accordance with one embodiment of the present invention. The second etching process continues to an endpoint such that the barrier layer 110 will be exposed at all locations substantially simultaneously and leaving only the portion 120 of the conductive material (e.g., copper, copper-containing alloys and combinations, and other conductive material) that fills the features 102, 104, 106.

The first etching process and the second etching process can be substantially similar or significantly different. By way of example, the first etching process can be an etching process for improving the local planarity of the overburden portion 112 due to local non-uniformities 114, 116, 118 (e.g., caused by feature 102, 104, 106 locations, sizes and concentrations in underlying layers). The entire additional layer 202 and a portion of the overburden portion 112 can be removed in the first etching process. By comparison, the second etching process can be a much more selective etching process that removes the bulk of the remaining, planar overburden 112' to the endpoint (i.e., when the barrier layer 110 is exposed).

Figure 4B:
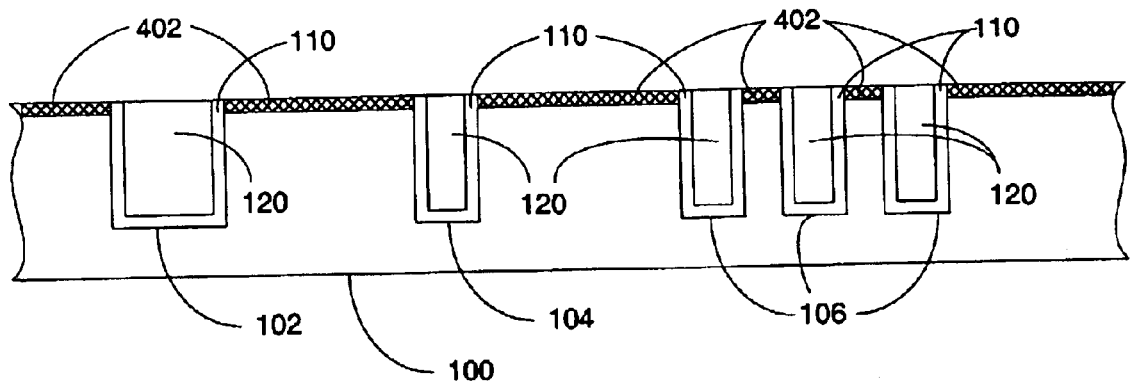
FIG. 4B shows the substrate having undergone a barrier removal process in accordance with one embodiment of the present invention.

FIG. 4B shows the substrate having undergone a barrier removal process in accordance with one embodiment of the present invention. A portion of the barrier layer 110 is removed to expose an underlying mask layer 402. Only the portion of the barrier layer 110 that is formed within the features 102, 104, 106 remain. A typical second etching process removes the bulk portion of the overburden 112 at high rate and preferably with a high selectivity to the barrier layer 110. By way of example, if the overburden portion 112 is copper, a halogen—based chemistry (e.g., Cl2, CF4, HCl, HBr, BCl3) can be effectively used for the second etching process. In another approach a physically dominant etch process such as an Ar (or other noble or inert gas) based sputter process can be used. Various process parameters can be adjusted to control etch rates and selectivity. The various process parameters can include adjusting process variables such as substrate temperature balance of reactive species, and inclusion of one or more additives (e.g., H2, O2, Ar, He, Xe, Ne, Kr, etc.).

Figure 5:
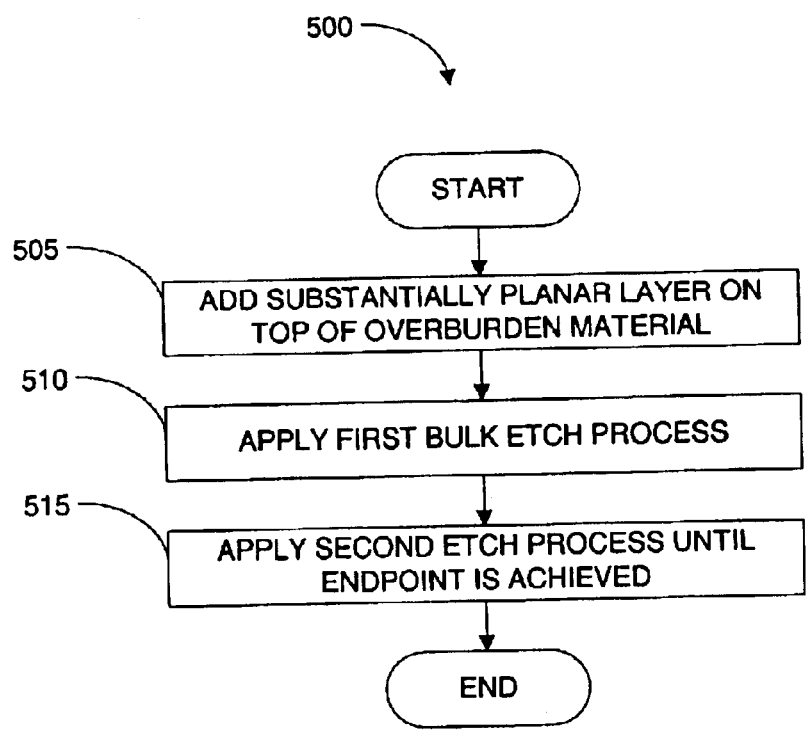
FIG. 5 is a flowchart of the method operations of performing a local planarization, in accordance with one embodiment of the present invention.

FIG. 5 is a flowchart 500 of the method operations of performing a local planarization, in accordance with one embodiment of the present invention. In operation 505, the additional layer 202 is added on top of the conductive overburden portion 112. In operation 510, the first etch process is applied to remove the majority of the additional layer 202 and the conductive overburden portion 112. In operation 515, the second etch process is applied to remove the remaining overburden portion 112' to the endpoint.

In an alternative embodiment, operation 515 can also include a finish etch process as described above. Subsequent processes after the finish etch can include selective barrier removal and passivating the remaining conductive material 120 to prevent corrosion and provide stability for further processing. An additional operation after the finish etch process can be designed not to significantly remove any material but only passivate the remaining conductive material 120 to prevent corrosion and provide stability for further processing.

Figure 6A:
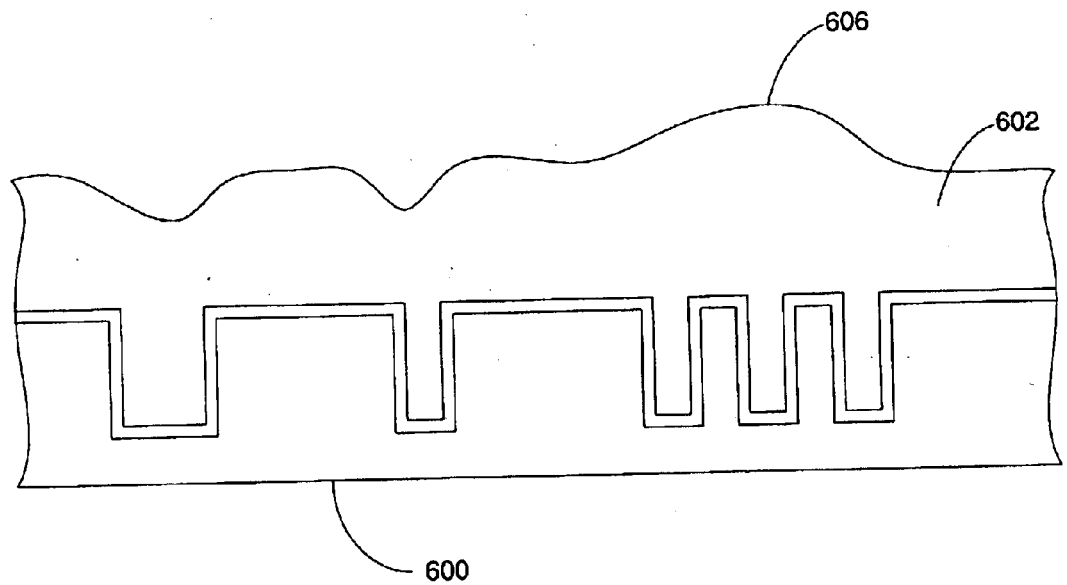
FIGS. 6A–6D show a sequence of chemical conversion and etch-back processes applied to a substrate to increase local uniformity, in accordance with one embodiment of the present invention.

FIGS. 6A–6D show a sequence of chemical conversion and etch-back processes applied to a substrate 600 to increase local uniformity, in accordance with one embodiment of the present invention. FIG. 7 is a flowchart 700 of the method operations of the chemical conversion and etch-back processes applied to a substrate 600 to increase local uniformity, in accordance with one embodiment of the present invention. As shown in FIG. 6A, the substrate 600 has a substantially non-planar overburden portion 602 with non-planar surface profile 606, similar to the substrate 100 described in FIG. 1 above.

Figure 6B:
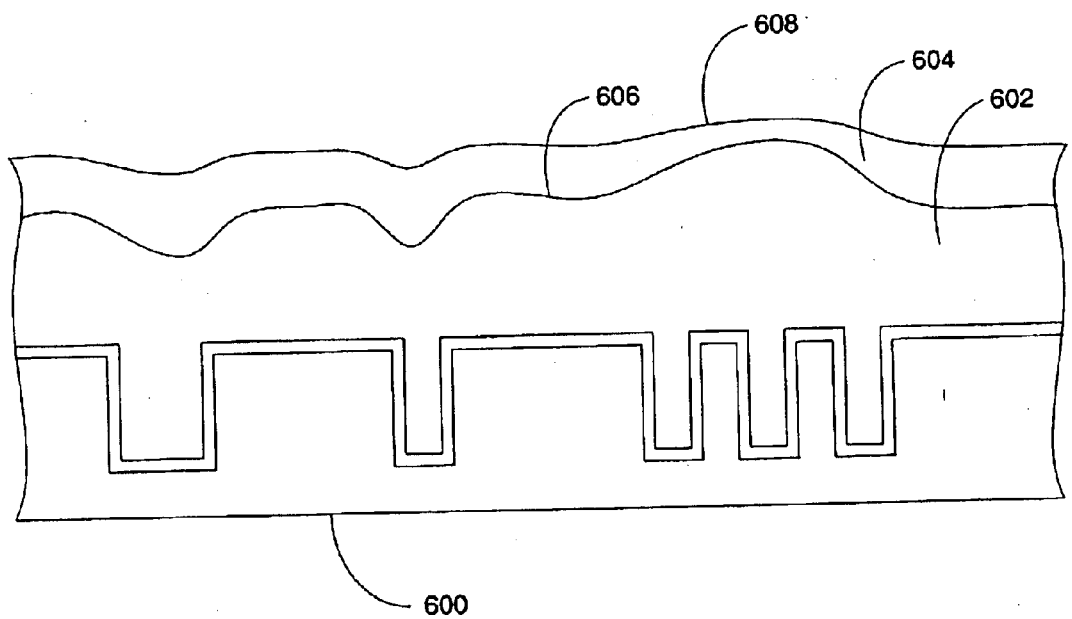
Figure 7:
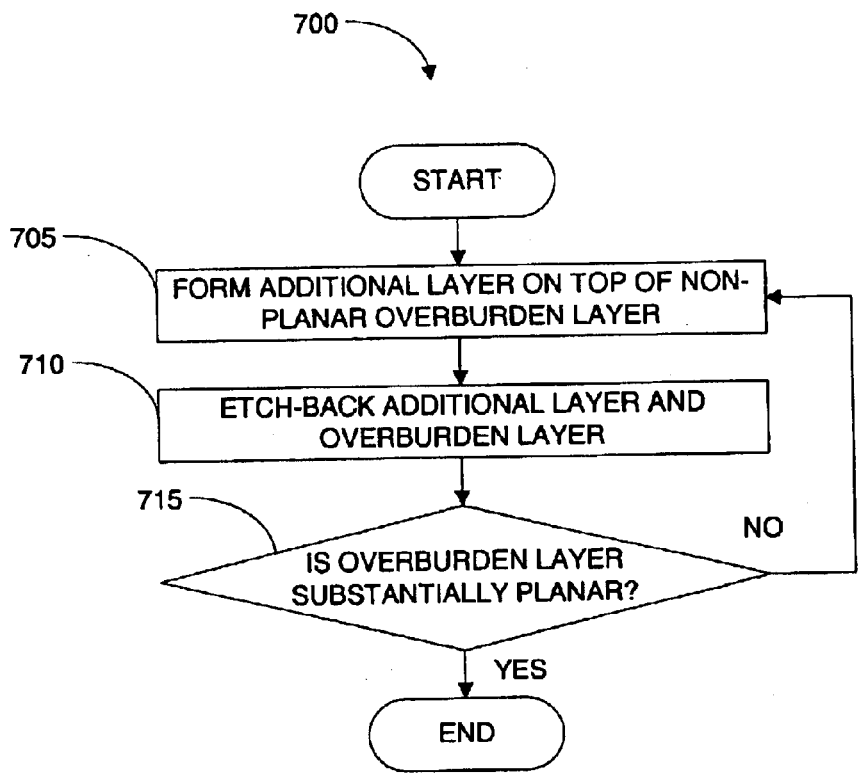
FIG. 7 is a flowchart of the method operations of the chemical conversion and etch-back processes applied to a substrate to increase local uniformity, in accordance with one embodiment of the present invention.

Referring now to FIGS. 6B and 7, in operation 705, an additional layer 604 is formed on top of the overburden portion 602. The additional layer 604 may be deposited or formed on the overburden portion 602. By way of example, the additional layer 604 can be formed through a chemical conversion of a top-most portion of the overburden portion 602. If the overburden portion 602 is copper or copper alloy, then a controlled exposure to a gas can form a copper reaction product layer 604. One example is a halogen gas that can form a Cu-halide layer 604. The copper reactant layer 604 diffuses into the surface of the copper overburden 602 to convert a top portion of the copper overburden 602.

Processes for chemical conversion of copper are known in the art, such as Nagraj S. Kulkarni and Robert T. DeHoff, "Application of Volatility Diagrams for Low Temperature, Dry Etching, and Planarization of Copper", Journal of Electrochemical Society, 149 (11) G620–G632, 2002.

In another example, the additional layer 604 can be deposited on the overburden portion 602. The deposited layer 604 can include a polymer layer or an oxide layer being deposited on the overburden portion 602.

Figure 6C:
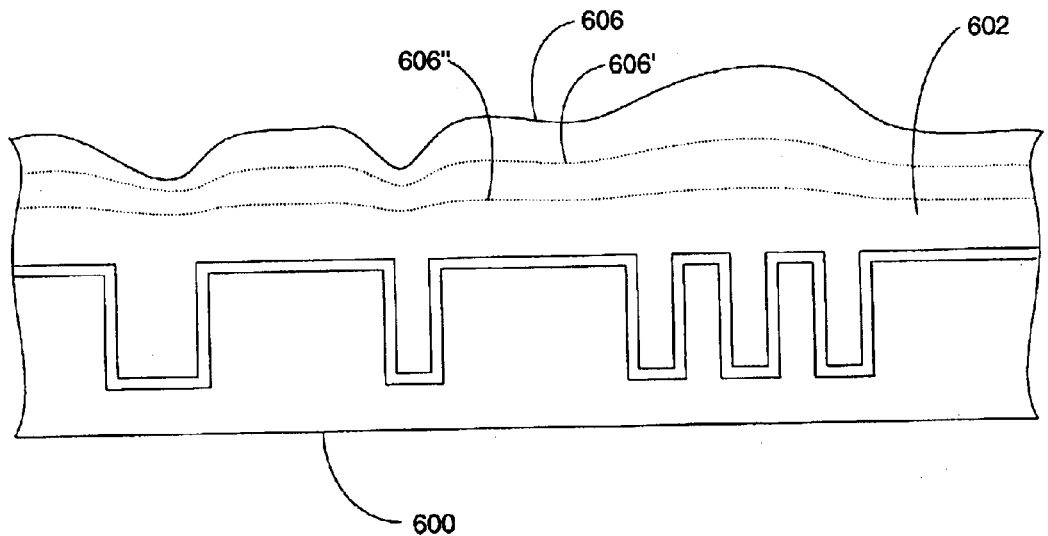
Figure 6D:
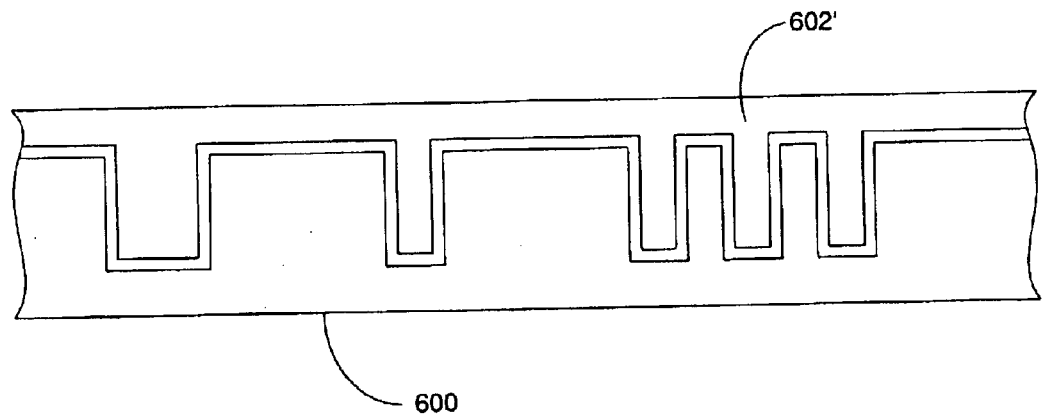

Referring now to operation 710 and FIG. 6C, an etch-back process is applied to remove the additional layer 604. A portion of the overburden portion 602 may also be removed. Removing the additional layer 604 results in further softening (i.e., planarizing) of the profile of the overburden portion 602 to profile 606'. The Cu-halide substantially softens the contours of the overburden portion 602. A Cu-halide can also maintain a substantially 1:1 etch-back selectivity with the copper overburden portion 602. Operations 705 and 710 can be repeated multiple times to substantially planarize the overburden portion 602 to subsequent profiles 606' and 606", as shown in FIG. 6D, until the resulting profile is substantially planar.

Chemical conversion of copper overburden portion 602 utilizing shape dependence of compound formation can be typically achieved by oxidizing the copper at the Cu-reactive species interface. Copper oxidization in this instance can include a chemical conversion of elemental copper to a copper compound with copper in a positive oxidation state. By way of example, oxidation of the copper to cuprous- or cupric chloride (CuCl or CuCl2) at the surface can occur in a chlorine plasma at lower temperatures (e.g., <200 degrees C.).

The etch-back process involves reduction of this copper compound to another chemical compound capable of being volatile and thus leaving the surface of the remaining overburden 602' at the fixed substrate temperature. By way of example, there can be a reduction of the CuCl2 to volatile Cu3Cl3 in the presence of reactive hydrogen species (e.g., H2 plasma). Alternating the shape-dependent conversion followed by etch-back of the converted portion can lead to bulk removal of the copper overburden portion 602, while simultaneously planarizing the topography (e.g., profile) of the copper overburden 602.

In operation 715, if the overburden portion 602 is substantially planarized, then the method operations end. Alternatively, if in operation 715, the overburden portion 602 is not substantially planarized, then the method operations continue at operation 705 above. In one embodiment, operations 705–715 can occur in situ within a single etch chamber. In an alternative embodiment, operation 710 can occur ex situ and can include ECD or low-down force CMP processes to achieve the substantially planar overburden portion 602' as shown in FIG. 6D.

The method operations described in FIGS. 6A–7 can be used as a planar bulk removal process that performs both planarization of the non-planar overburden portion 602 and removal of the bulk of the overburden portion 602.

The local planarization of the substrates 100, 600 can be determined through any one or more of several known layer thickness mapping technologies that are known in the art. By way of example, an eddy current sensor can map the thickness of the overburden portion 112, 112' as described in commonly owned U.S. Pat. application Ser. No. 10/328,912 entitled System, Method And Apparatus For Thin-Film Substrate Signal Separation Using Eddy Current by Gotkis et al., filed on Dec. 23, 2002 and U.S. Pat. application Ser. No. 10/251,033 entitled System And Method For Metal Residue Detection And Mapping Within A Multi-Step Sequence by Gotkis et al., filed on Sep. 19, 2002, which are incorporated by reference herein, in their entirety.

The methods and systems described in FIGS. 1–7 above describe various approaches to substantially eliminating local, pattern dependant non-uniformities in an overburden portion. However, methods and systems described in FIGS. 1–7 above do not directly address correction of global non-uniformities. Global non-uniformities can include variations in removal rates of material in the center of the substrate as compared to the edge of the substrate and other non-uniformities that are not localized phenomena.

Figure 8:
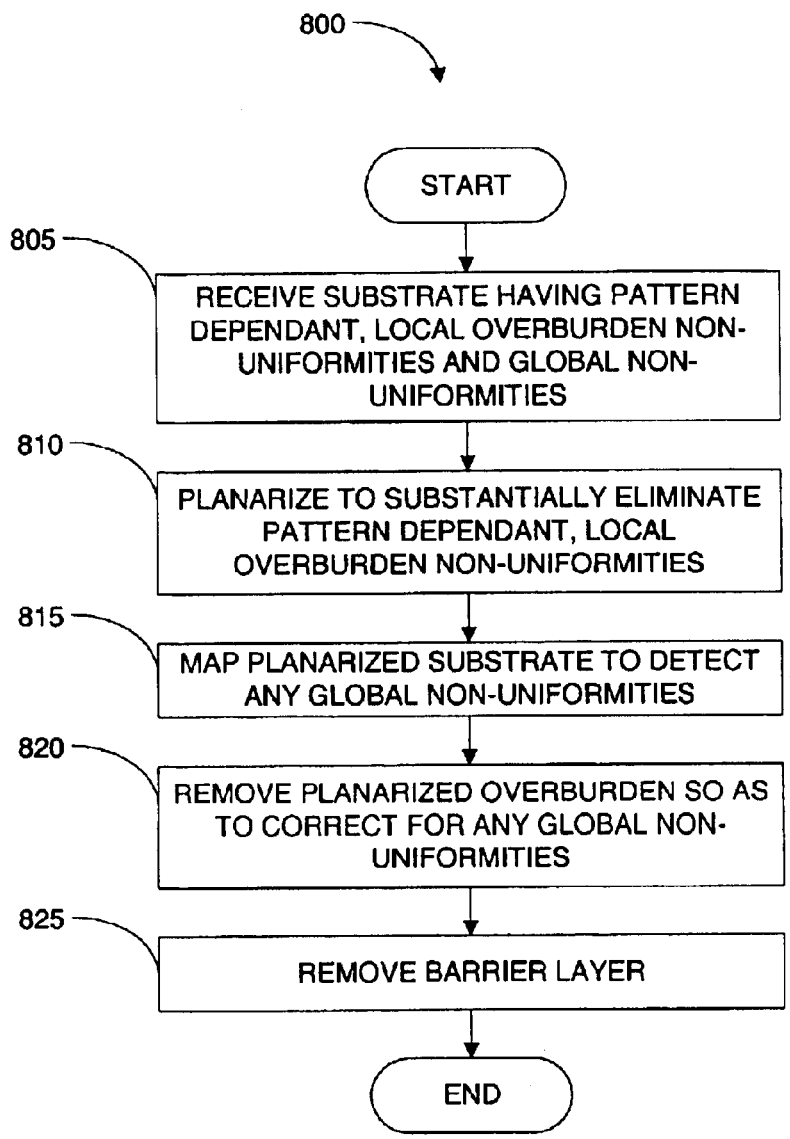
FIG. 8 is a flowchart of the method operation of correcting global non-uniformities in accordance with one embodiment of the present invention.

FIG. 8 is a flowchart of the method operation 800 of correcting global non-uniformities in accordance with one embodiment of the present invention. In operation 805, a substrate having localized non-uniformities such as feature-pattern dependant non-uniformities in the overburden portion is received. In operation 810, the localized non-uniformities are substantially eliminated such as through CMP, ECP or the methods and systems described in FIGS. 1–7 above or any other method known in the art. Substantially removing the localized non-uniformities forms a substantially, locally planarized overburden portion such as the planarized overburden portion 112' shown in FIG. 3 above.

Figure 9:
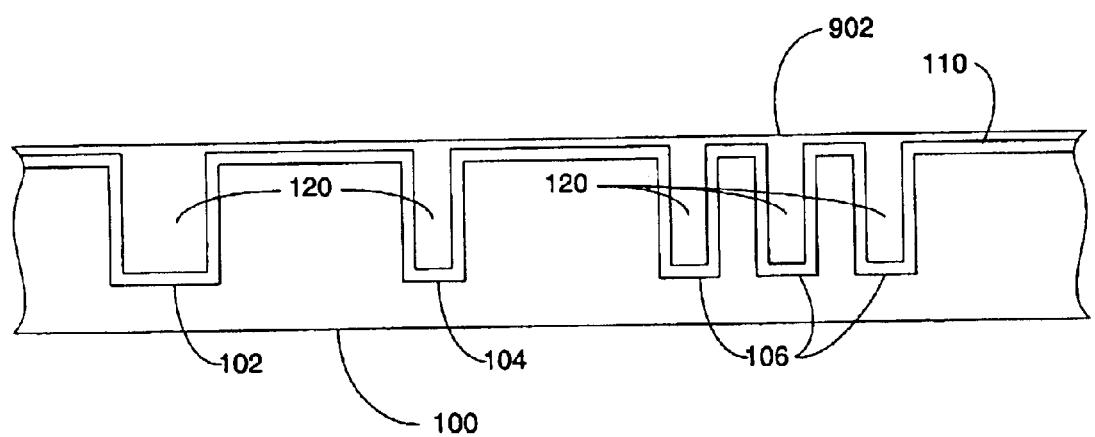
FIG. 9 shows a substantially removed, planarized overburden portion in accordance with one embodiment of the present invention.

FIG. 9 shows a substantially removed, planarized overburden portion 902 in accordance with one embodiment of the present invention. The substantially removed, planarized overburden portion 902 can be a relatively thin overburden portion such as a few hundred angstroms in thickness.

In operation 815, the substrate with the planarized overburden portion is mapped to identify and quantify any global non-uniformities in the planarized overburden portion. The planarized overburden portion can be mapped with any one or more of several known layer thickness mapping technologies that are known in the art as described above. The mapping can be in situ (within the current process chamber) or ex situ (external to the current process chamber). An in situ mapping process can also be dynamic and allow for the subsequent processes to be dynamically adjusted as the subsequent processes progress.

In operation 820, the location and quantity of the global non-uniformities, as determined in operation 815 above, are removed in a substantially mechanical stress-free process by adjusting an etching process to address the specific requirements of the detected global non-uniformities in a finish etch process. By way of example, if the remaining overburden portion 902 were approximately 500 angstroms thick in the center and 300 angstroms thick on the edge, then the recipe can be adjusted such that the center to edge non-uniformity can be compensated for so that the entire barrier layer 110 will be exposed simultaneously. The stress-free process avoids the CMP problems described above because no mechanical force is applied to the substrate during the etch-back process.

The recipe (e.g., selected values of process variables) that is selected is selective to barrier layer 110 (i.e., will etch the barrier at a much slower rate than the recipe will etch the copper, e.g., a typical selectivity range of copper etch over barrier etch in these processes is greater than about 1 but less than about 3) and that will minimize any recesses (e.g., excess removal of the conductive material 120 in the features 102, 104, 106).

The finish etch can have relatively slow etch rates for both copper of the remaining overburden portion 902 and the barrier layer 110 to minimize any recess into the features 102, 104, 106 with respect to the remaining height barrier of the barrier layer 110. As a result, the finish etch cannot have a very high selectivity to etch the copper.

A final etch-back process can also be included. The final etch-back process includes etch-back of the mask material and/or the ILD material with appropriate selectivity and uniformity control such that the final outcome provides substantially globally uniform and substantially planar features with minimal copper and ILD loss (e.g., any copper recess is globally uniform across the substrate 100 at the end of the final etch and barrier removal processes). In this instance, the final etch would include a uniform process to etch-back the mask material with high selectivity to minimize copper loss and minimize the copper recess. By way of example, a halogen-based process where the halogen concentration is low and the substrate temperature is low (e.g., less than about 200 degrees C.) will maintain a low copper etch rate while still sufficiently chemically etching the mask material. Any plasma feed gas including halogen reactive species (e.g., CF4, C2F6, C4F6) can be used. Etch rate control additives can include Ar, O2, CH2F2 and others can also be included.

If the global copper recess and/or mask/ILD loss are non-uniform across the substrate at the end of the finish etch and final etch-back process, then additional variations in the recipe must be taken to correct for the global non-uniformities. By way of example, typical instances are a result of etch non-uniformity are described as center fast or edge fast etch rates. In either of these instances, can result in a variation in copper recess and/or mask/ILD loss across the substrate. Compensation can be achieved to counter this variation to obtain globally planar features with minimal copper and mask loss utilizing appropriate uniformity and selectivity controls during the final etch-back of the mask/ILD material. In the instance of a center-fast finish etch process resulting in larger copper recess in the center of the substrate can be compensated for by an edge-fast final etch back process which selectively etches the mask material to bring to the same level as the copper level in the features 102, 104, 106. Typical selectivity obtained in this process is greater than about 2. Variations of the recipe to provide for uniformity control include pressure, temperature variation across substrate, ion flux uniformity controls, gas concentrations and chamber wall temperature. Variations to control selectivity include reactive halogen species concentration, substrate temperature, and bias power.

As used herein in connection with the description of the invention, the term "about" means +/– 10%. By way of example, the phrase "about 250 degrees C." indicates a range of between 225 degrees C. and 275 degrees C. It will be further appreciated that the instructions represented by the operations in FIGS. 5, 7, 8 are not required to be performed in the order illustrated, and that all the processing represented by the operations may not be necessary to practice the invention. Further, the processes described in FIGS. 5, 7 and 8 can also be implemented in software stored in any one of or combinations of the RAM, the ROM, or a hard disk drive of a computer or microprocessor control system (e.g., a process control system).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for planarizing a patterned semiconductor substrate comprising:
    receiving a patterned semiconductor substrate, having a conductive interconnect material filling a plurality of features in the pattern, the conductive interconnect material having an overburden portion having a localized non-uniformity;
    forming an additional layer on the overburden portion; and
    planarizing the additional layer and the overburden portion without imparting mechanical stress to the plurality of features, the additional layer being substantially entirely removed in the planarizing process.

2. The method of claim 1, wherein planarizing the additional layer and the overburden portion includes substantially eliminating a local, pattern dependant non-uniformity.

3. The method of claim 1, wherein the additional layer and the overburden portion have a substantially 1:1 etch selectivity.

4. The method of claim 1, wherein the additional layer is formed substantially planar.

5. The method of claim 4, wherein the additional layer is a substantially planar fill material.

6. The method of claim 4, wherein planarizing the additional layer and the overburden portion includes etching the additional layer and at least part of the overburden portion.

7. The method of claim 6, further comprising a second etch process to expose a barrier layer formed on the patterned features.

8. The method of claim 1, wherein forming the additional layer on the overburden portion includes chemically converting a top surface and a top portion of the overburden portion.

9. The method of claim 8, wherein chemically converting a top surface and a top portion of the overburden portion includes exposing the top surface of the overburden portion to a reactant gas.

10. The method of claim 9, wherein the reactant gas is a halogen.

11. The method of claim 9, wherein the additional layer is a halide reactant product of the overburden portion.

12. The method of claim 8, wherein planarizing the additional layer and the overburden portion includes etching the additional layer and at least part of the overburden portion.

13. The method of claim 8, wherein planarizing the additional layer and the overburden portion includes a reiterative process including:
    etching the additional layer;
    forming a second additional layer; and
    etching the second additional layer.

14. The method of claim 13, wherein the reiterative process occurs in situ.

15. The method of claim 14, wherein the reiterative process occurs ex situ.

16. The method of claim 1, wherein the conductive interconnect material includes copper.

17. The method of claim 1, wherein the conductive interconnect material includes elemental copper.

18. The method of claim 1, wherein the pattern is formed on the patterned semiconductor substrate in a dual damascene process.

19. A semiconductor device formed by a method comprising:
    receiving a patterned semiconductor substrate, having a conductive interconnect material filling a plurality of features in the pattern, the conductive interconnect material having an overburden portion having a localized non-uniformity;

forming an additional layer on the overburden portion; and planarizing the additional layer and the overburden portion without imparting mechanical stress to the plurality of features, the additional layer being substantially entirely removed in the planarizing process.

20. A method of forming a dual damascene interconnect structure comprising:

receiving a dual damascene patterned semiconductor substrate, having a conductive interconnect material filling a plurality of features in the dual damascene pattern, the conductive interconnect material having an overburden portion having a localized non-uniformity;

forming an additional layer on the overburden portion, the additional layer being formed substantially planar; and etching the additional layer and at least part of the overburden portion to substantially planarize the overburden portion, the additional layer being substantially entirely removed.

21. A method of forming a dual damascene interconnect structure comprising:

receiving a dual damascene patterned semiconductor substrate, having a conductive interconnect material filling a plurality of features in the dual damascene pattern, the conductive interconnect material having an overburden portion having a localized non-uniformity;

chemically converting a top surface and a top portion of the overburden portion to form an additional layer on the overburden portion; and planarizing the additional layer and the overburden portion, the additional layer being substantially entirely removed in the planarizing process, the planarizing process includes a reiterative process including:

etching the additional layer;

forming a second additional layer; and etching the second additional layer.

22. The method of claim 21, wherein planarizing the additional layer and the overburden portion further includes planarizing the additional layer and the overburden portion with a planarizing CMP process.

23. The method of claim 22, wherein at least one of the bulk removal CMP process and the planarizing CMP process is a low downforce CMP process.

24. The method of claim 23, wherein at least one of the bulk removal CMP process and the planarizing CMP process includes a CMP chemistry that is not selective to at least one of a barrier layer and a dielectric layer.

25. A method for planarizing a patterned semiconductor substrate comprising:

receiving a patterned semiconductor substrate, having a conductive interconnect material filling a plurality of features in the pattern, the conductive interconnect material having an overburden portion having a localized non-uniformity;

planarizing the overburden portion to substantially remove a bulk of the overburden portion including etching the overburden portion to remove at least a portion of the bulk of the overburden portion, a remaining portion of the overburden portion being substantially planarized; and etching the planarized overburden portion to substantially remove the overburden portion.

26. The method of claim 25, wherein planarizing the overburden portion also includes a low downforce CMP process.

27. The method of claim 25, wherein at least one of the bulk removal process and the planarizing process includes CMP process that includes a CMP chemistry that is not selective to at least one of a barrier layer and a dielectric layer.

* * * * *